(12) United States Patent
Daimon

(10) Patent No.: US 12,512,812 B2
(45) Date of Patent: Dec. 30, 2025

(54) ACOUSTIC WAVE DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 866 days.

(21) Appl. No.: 17/465,904

(22) Filed: Sep. 3, 2021

(65) Prior Publication Data

US 2021/0399712 A1    Dec. 23, 2021

Related U.S. Application Data

(63) Continuation of application No. PCT/JP2020/010592, filed on Mar. 11, 2020.

(30) Foreign Application Priority Data

Mar. 11, 2019    (JP) ................. 2019-044131

(51) Int. Cl.
*H03H 9/02*    (2006.01)
*H03H 9/25*    (2006.01)

(52) U.S. Cl.
CPC .... *H03H 9/02866* (2013.01); *H03H 9/02559* (2013.01); *H03H 9/02637* (2013.01); *H03H 9/25* (2013.01)

(58) Field of Classification Search
CPC .......... H03H 9/02866; H03H 9/02559; H03H 9/02535; H03H 9/25
USPC ...... 310/313 R, 313 A, 313 B, 313 C, 313 D
See application file for complete search history.

(56) References Cited

U.S. PATENT DOCUMENTS

| 2014/0203893 | A1  | 7/2014 | Kando et al. |
| 2017/0250674 | A1  | 8/2017 | Takamine et al. |
| 2018/0159495 | A1* | 6/2018 | Inoue ................. H03H 9/02866 |
| 2018/0205361 | A1* | 7/2018 | Kishimoto ............. H03H 9/175 |

(Continued)

FOREIGN PATENT DOCUMENTS

| JP | 2015-122566 A | 7/2015 |
| KR | 1020140064916 A | 5/2014 |

(Continued)

OTHER PUBLICATIONS

Official Communication issued in International Patent Application No. PCT/JP2020/010592, mailed on Jun. 2, 2020.

(Continued)

*Primary Examiner* — Derek J Rosenau
(74) *Attorney, Agent, or Firm* — Keating & Bennett, LLP

(57) ABSTRACT

An acoustic wave device includes a support substrate, a first high acoustic velocity film on the support substrate, a low acoustic velocity film on the first high acoustic velocity film, a second high acoustic velocity film on the low acoustic velocity film, a piezoelectric layer on the second high acoustic velocity film, and an IDT on the piezoelectric layer. Bulk waves propagate in the low acoustic velocity film more slowly than bulk waves propagate in the piezoelectric layer, bulk waves propagate in the first high acoustic velocity film faster than acoustic waves propagate on the piezoelectric layer, and bulk waves propagate in the second high acoustic velocity film faster than or as fast as bulk waves propagate in the first high acoustic velocity film.

14 Claims, 4 Drawing Sheets

(56) References Cited

U.S. PATENT DOCUMENTS

2020/0177153 A1    6/2020  Nakagawa et al.
2021/0036679 A1*   2/2021  Kishino ............ H03H 9/02157

FOREIGN PATENT DOCUMENTS

| WO | 2013/047433 A1 | 4/2013 |
| WO | 2016/103953 A1 | 6/2016 |
| WO | 2019/031202 A1 | 2/2019 |

OTHER PUBLICATIONS

Office Action in KR10-2021-7025279, mailed Oct. 24, 2023, 5 pages.

* cited by examiner

ACOUSTIC WAVE DEVICE

CROSS REFERENCE TO RELATED APPLICATIONS

This application claims the benefit of priority to Japanese Patent Application No. 2019-044131 filed on Mar. 11, 2019 and is a Continuation Application of PCT Application No. PCT/JP2020/010592 filed on Mar. 11, 2020. The entire contents of each application are hereby incorporated herein by reference.

BACKGROUND OF THE INVENTION

1. Field of the Invention

The present invention relates to an acoustic wave device.

2. Description of the Related Art

Acoustic wave devices are in widespread use, for example, in filters in cellular phones. International Publication No. 2016/103953 discloses an example of an acoustic wave device. This acoustic wave device includes a support substrate, a bonding film, a high acoustic velocity film, a low acoustic velocity film, and a piezoelectric film stacked in this order. On the piezoelectric film, there are multiple IDTs (InterDigital Transducers).

In recent years, the use of the 5-GHz band has becoming more and more important. When an acoustic wave filter that uses the 5-GHz band and another acoustic wave filter are connected to a common antenna end, a response of a higher-order mode occurs in the vicinity of double the resonant frequency of the main mode of the second acoustic wave filter. For acoustic wave devices like that described in International Publication No. 2016/103953, however, it has been difficult to reduce such a response of a higher-order mode sufficiently.

SUMMARY OF THE INVENTION

Preferred embodiments of the present invention provide acoustic wave devices each having reduced responses of higher-order modes.

An acoustic wave device according to a preferred embodiment of the present invention includes a support substrate; a first high acoustic velocity film on the support substrate; a low acoustic velocity film on the first high acoustic velocity film; a second high acoustic velocity film on the low acoustic velocity film; a piezoelectric layer on the second high acoustic velocity film; and an IDT on the piezoelectric layer. A bulk wave propagates in the low acoustic velocity film more slowly than a bulk wave propagates in the piezoelectric layer, a bulk wave propagates in the first high acoustic velocity film faster than an acoustic wave propagates on the piezoelectric layer, and a bulk wave propagates in the second high acoustic velocity film faster than or as fast as a bulk wave propagates in the first high acoustic velocity film.

An acoustic wave device according to a preferred embodiment of the present invention includes a support substrate made of silicon; a first high acoustic velocity film on the support substrate, the first high acoustic velocity film including silicon nitride, silicon oxynitride, or quartz; a low acoustic velocity film on the first high acoustic velocity film, the low acoustic velocity film made of a material that is primarily silicon oxide, tantalum oxide, or silicon oxide doped with at least one of fluorine, carbon, or boron; a second high acoustic velocity film on the low acoustic velocity film, the second high acoustic velocity film primarily including aluminum oxide, aluminum nitride, titanium nitride, silicon carbide, silicon nitride, or DLC; a piezoelectric layer on the second high acoustic velocity film, the piezoelectric layer made of lithium tantalate or lithium niobate; and an IDT on the piezoelectric layer.

Acoustic wave devices according to preferred embodiments of the present invention each reduce higher-order modes.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following describes specific preferred embodiments of the present invention with reference to drawings to make the present invention clearly understood.

The preferred embodiments set forth herein are illustrative, and partial replacement or combination of configurations between different preferred embodiments is possible.

Figure 1:
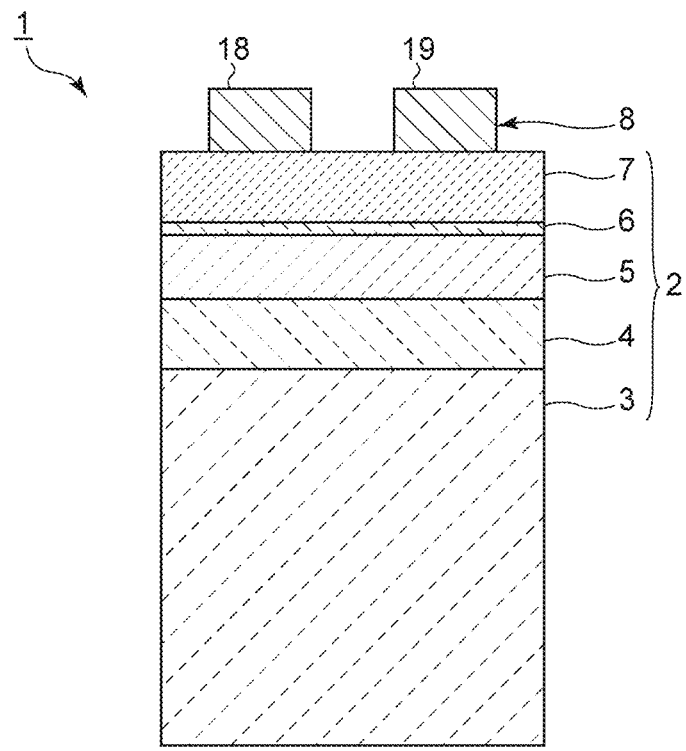
FIG. 1 is a partial front cross-sectional view of an acoustic wave device according to Preferred Embodiment 1 of the present invention.
Figure 2:
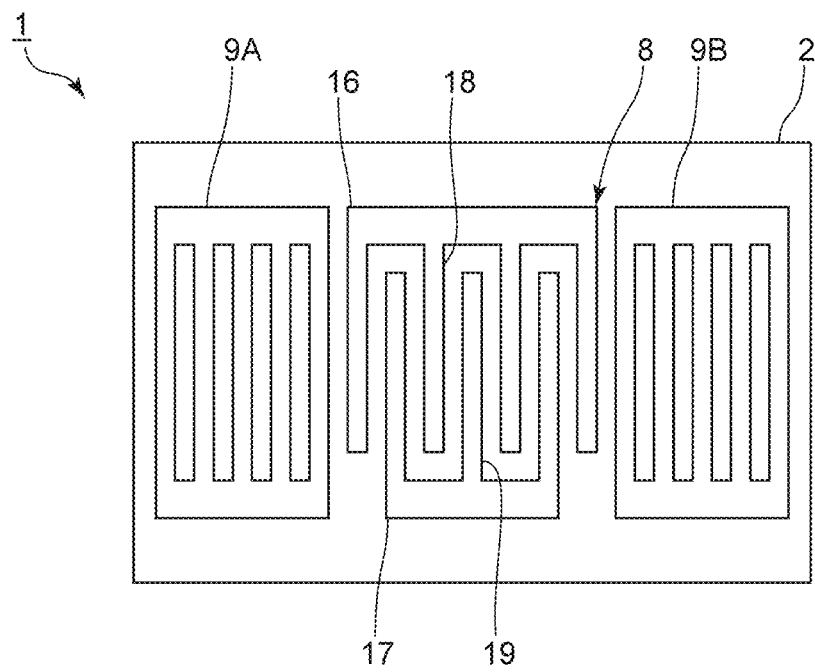
FIG. 2 is a plan view of an acoustic wave device according to Preferred Embodiment 1 of the present invention.

FIG. 1 is a partial front cross-sectional view of an acoustic wave device according to Preferred Embodiment 1 of the present invention. FIG. 2 is a plan view of an acoustic wave device according to Preferred Embodiment 1 of the present invention. FIG. 1 illustrates a portion in the vicinity of a pair of electrode fingers of an IDT, which is described later herein.

The acoustic wave device 1 includes a piezoelectric substrate 2. The piezoelectric substrate 2 includes a support substrate 3, a first high acoustic velocity film 4 on the support substrate 3, a low acoustic velocity film 5 on the first high acoustic velocity film 4, a second high acoustic velocity film 6 on the low acoustic velocity film 5, and a piezoelectric layer 7 on the second high acoustic velocity film 6. An IDT 8 is provided on the piezoelectric layer 7.

Applying an alternating voltage to the IDT 8 will excite acoustic waves. The main mode of the acoustic wave device 1 according to the present preferred embodiment is SH (Shear Horizontal) waves. As illustrated in FIG. 2, on both sides, in the direction of propagation of the acoustic waves, of the IDT 8 on the piezoelectric substrate 2, a reflector 9A and a reflector 9B are provided. The acoustic wave device 1 according to the present preferred embodiment is an acoustic wave resonator, for example. An acoustic wave device according to the present invention, however, does not need to be an acoustic wave resonator, and may be, for example, a band pass filter, duplexer, or multiplexer, each of which includes multiple acoustic wave resonators.

In the present preferred embodiment, the piezoelectric layer 7, illustrated in FIG. 1, is a 55° Y-cut, X-propagating lithium tantalate layer, for example. The thickness of the piezoelectric layer 7 is equal to or smaller than about 1λ, where λ is the wavelength, which is determined by the finger pitch of the IDT. The finger pitch represents the center-to-center distance between electrode fingers. These, however, are not the only possible cut-angle of, material for, and thickness of the piezoelectric layer 7. The material for the piezoelectric layer 7 may alternatively be, for example, lithium niobate.

Figure 3:
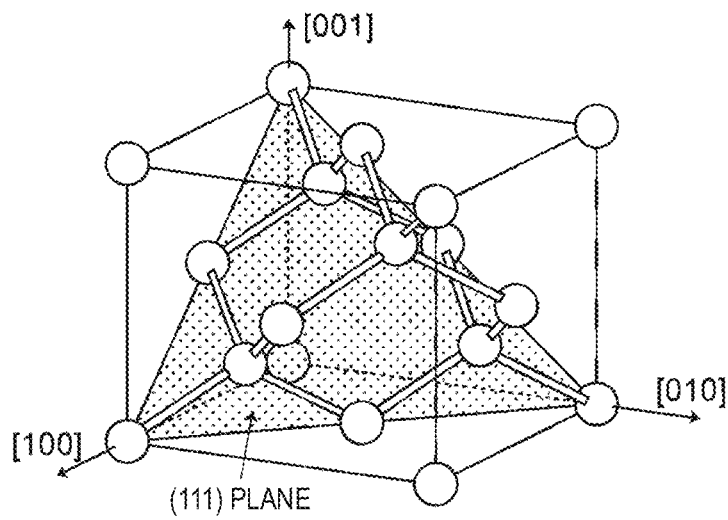
FIG. 3 is a schematic diagram for describing the crystallographic orientation Si (111).

In the present preferred embodiment, the support substrate 3 is a silicon substrate, for example. More specifically, the crystallographic orientation of the silicon of the support substrate 3 is Si (111), for example. The angle of propagation of the support substrate 3, which is the angle between the direction of propagation of the acoustic waves and the crystallographic axis [1-10] of the silicon in the (111) plane, is about 46°, for example. Si (111) in this context means that the substrate has been cut along the (111) plane, which is perpendicular or substantially perpendicular to the crystallographic axis represented by Miller indices of [111], or any other crystallographically equivalent plane in the crystal structure of diamond-structured silicon as illustrated in FIG. 3. These, however, are not the only possible crystallographic orientation of, angle of propagation of, and material for the support substrate 3. For example, of the two sides of the silicon of the support substrate 3, one closer to the first high acoustic velocity film 4 and the other closer to the IDT 8, the side closer to the first high acoustic velocity film 4 may be (111)-oriented.

The first high acoustic velocity film 4 is a relatively high-speed film in terms of acoustic velocity. More specifically, bulk waves propagate in the first high acoustic velocity film 4 faster than acoustic waves propagate on the piezoelectric layer 7. In the present preferred embodiment, the first high acoustic velocity film 4 is a silicon nitride film, for example. This, however, is not the only possible material for the first high acoustic velocity film 4. For example, the first high acoustic velocity film 4 can be a medium primarily including a material, such as aluminum oxide, silicon carbide, silicon oxynitride, silicon, sapphire, lithium tantalate, lithium niobate, quartz, alumina, zirconia, cordierite, mullite, steatite, forsterite, magnesia, DLC (diamond-like carbon), or diamond.

The low acoustic velocity film 5 is a relatively low-speed film in terms of acoustic velocity. More specifically, bulk waves propagate in the low acoustic velocity film 5 more slowly than bulk waves propagate in the piezoelectric layer 7. In the present preferred embodiment, the low acoustic velocity film 5 is a silicon oxide film, for example. Silicon oxide is represented by $SiO_x$, where x is any positive number. For the acoustic wave device 1, the silicon oxide of the low acoustic velocity film 5 is $SiO_2$, for example. This, however, is not the only possible material for the low acoustic velocity film 5. For example, the low acoustic velocity film 5 can be made of a material that primarily includes glass, silicon oxynitride, tantalum oxide, or silicon oxide doped with at least one of fluorine, carbon, or boron.

The second high acoustic velocity film 6 is even higher-speed than the first high acoustic velocity film 4 in terms of acoustic velocity. More specifically, bulk waves propagate in the second high acoustic velocity film 6 faster than or as fast as bulk waves propagate in the first high acoustic velocity film 4. In the present preferred embodiment, the second high acoustic velocity film 6 is an aluminum oxide film, for example. This, however, is not the only possible material for the second high acoustic velocity film 6. For example, the second high acoustic velocity film 6 can be a medium primarily including material, such as aluminum nitride (AlN), silicon nitride (SiN), titanium nitride (TiN), silicon carbide (SiC), or DLC. The second high acoustic velocity film 6 may be made of the same material as the first high acoustic velocity film 4.

In the present preferred embodiment, the piezoelectric layer 7 is indirectly on the low acoustic velocity film 5, with the second high acoustic velocity film 6 therebetween. With a structure in which a first high acoustic velocity film 4, a low acoustic velocity film 5, and a piezoelectric layer 7 are stacked, the acoustic wave device 1 confines the energy of its main mode on the piezoelectric layer 7 side effectively.

As illustrated in FIG. 2, the IDT 8 includes a first busbar 16 and a second busbar 17 opposite each other. The IDT 8 includes multiple first electrode fingers 18 each coupled at one end to the first busbar 16. In addition, the IDT 8 includes multiple second electrode fingers 19 each coupled at one end to the second busbar 17. The first electrode fingers 18 and the second electrode fingers 19 are interdigitated.

The IDT 8 is a multilayer metal film including a Ti layer, an Al layer, and a Ti layer stacked in this order from the piezoelectric layer 7 side. The reflectors 9A and 9B are also made of the same materials as the IDT 8, for example. These, however, are not the only possible materials for the IDT 8 and the reflectors 9A and 9B. The IDT 8 and the reflectors 9A and 9B may alternatively be single-layer metal films.

Referring to FIG. 1, the present preferred embodiment has a structure including a first high acoustic velocity film 4, a low acoustic velocity film 5, a second high acoustic velocity film 6, and a piezoelectric layer 7 that are stacked, and the second high acoustic velocity film 6 is even higher-speed than the first high acoustic velocity film 4 in terms of acoustic velocity. This reduces higher-order modes. The higher-order mode occurs in a vicinity of double the resonant frequency of the main mode. The following describes this advantageous effect by comparing the present preferred embodiment and a comparative example.

An acoustic wave device having a structure of Preferred Embodiment 1 and an acoustic wave device of a Comparative Example were prepared. The Comparative Example differs from Preferred Embodiment 1 in that it does not include a second high acoustic velocity film.

The parameters of the acoustic wave device having a structure of Preferred Embodiment 1 were as follows.

Support substrate: Material . . . silicon, crystallographic orientation . . . Si (111), angle of propagation . . . about 46°
First high acoustic velocity film: Material . . . silicon nitride (SiN), thickness . . . about 300 nm
Low acoustic velocity film: Material . . . silicon oxide ($SiO_2$), thickness . . . about 300 nm
Second high acoustic velocity film: Material . . . aluminum oxide ($Al_2O_3$), thickness . . . about 30 nm
Piezoelectric layer: Material . . . lithium tantalate ($LiTaO_3$), cut-angle . . . 55° Y-cut, X-propagating
IDT: Layer materials . . . Ti/Al/Ti, from the piezoelectric layer side, layer thickness . . . about 12 nm/about 100 nm/about 10 nm, from the piezoelectric layer side
Finger pitch of the IDT: about 1 μm
The number of pairs of electrode fingers: 1 (This is 1 because the simulation was carried out by the finite element method using periodic boundary conditions; the simulated structure itself was made assuming it had an infinite number of finger pairs along the row of pairs.)

The parameters of the acoustic wave device of the Comparative Example were the same or substantially the same as those of the acoustic wave device according to Preferred Embodiment 1, except that it did not include a second high acoustic velocity film.

Figure 4:
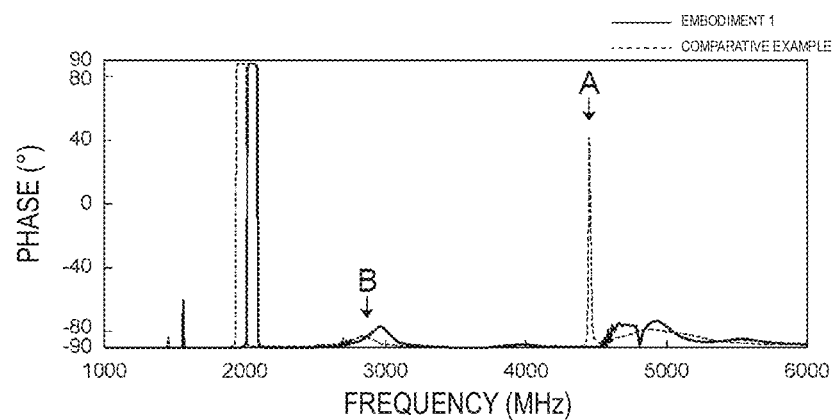
FIG. 4 is a diagram illustrating the phase characteristics of an acoustic wave device according to Preferred Embodiment 1 of the present invention and that of a comparative example.

FIG. 4 is a diagram illustrating the phase characteristics of the acoustic wave device according to Preferred Embodiment 1 and that of the Comparative Example. In FIG. 4, the solid line represents results from Preferred Embodiment 1, and the broken line represents results from the Comparative Example.

As can be seen, in the Comparative Example, a large higher-order mode occurred at the frequency indicated by arrow A in FIG. 4. In Preferred Embodiment 1, the higher-order mode was small. The data also demonstrate that the higher-order mode in the vicinity of the frequency indicated by arrow B was also small in Preferred Embodiment 1.

In the Comparative Example, it is difficult to reduce higher-order modes because not only the main mode but also higher-order modes are confined on the piezoelectric layer side. In Preferred Embodiment 1, the inventor of preferred embodiments of the present invention determined that higher-order modes are reduced for the following reason.

As illustrated in FIG. 1, in Preferred Embodiment 1, a second high acoustic velocity film 6 is between a low acoustic velocity film 5 and a piezoelectric layer 7. In addition to this, the second high acoustic velocity film 6 is even higher-speed than the first high acoustic velocity film 4 in terms of acoustic velocity. This effectively increases the acoustic velocity of the higher-order mode in the vicinity of double the resonant frequency. The higher-order mode propagates faster than bulk waves in the support substrate 3 and therefore leaks to the support substrate 3 side. The higher-order mode is reduced as a consequence. As shown in FIG. 4, the phase angle of the main mode in Preferred Embodiment 1 is equal or substantially equal to that in the Comparative Example, in which the acoustic wave device did not include second high acoustic velocity film 6, indicating the intensity of the main mode was preserved.

The acoustic wave device 1 according to Preferred Embodiment 1 provides reduced higher-order modes, for example in the 5-GHz band. When the acoustic wave device 1 is connected to a common element, such as an antenna, together with a filter device whose pass band is in the 5-GHz band, therefore, the influence on the filter characteristics of the filter device is limited.

The acoustic wave device 1 according to Preferred Embodiment 1 also provides a reduced higher-order mode in the middle band. When the acoustic wave device 1 is connected to a common element, such as an antenna, together with a filter device whose pass band is in the middle band, the influence on the filter characteristics of the filter device is limited.

The material for the second high acoustic velocity film does not need to be aluminum oxide. Table 1, below, lists preferred combinations of material and thickness for the second high acoustic velocity film 6.

TABLE 1

| Material for the second high acoustic velocity film | Thickness T of the second high acoustic velocity film (μm) | Thickness T of the second high acoustic velocity film (λ) |
|---|---|---|
| Aluminum oxide ($Al_2O_3$) | $0.001 \le T \le 1$ | $0.0005 \le T \le 0.5$ |
| Aluminum nitride (AlN) | $0.001 \le T \le 1$ | $0.0005 \le T \le 0.5$ |
| Silicon nitride (SiN) | $0.001 \le T \le 1$ | $0.0005 \le T \le 0.5$ |
| Titanium nitride (TiN) | $0.001 \le T \le 1$ | $0.0005 \le T \le 0.5$ |
| Silicon carbide (SiC) | $0.001 \le T \le 1$ | $0.0005 \le T \le 0.5$ |
| Diamond-like carbon (DLC) | $0.001 \le T \le 0.2$ | $0.0005 \le T \le 0.1$ |

When the material for and the thickness of the second high acoustic velocity film 6 are any of the combinations listed in Table 1, the higher-order mode is reduced without increasing the response in the middle band. The following describes this in detail.

FIGS. 5 to 10 illustrate the phase characteristics of a higher-order mode that occurs in a frequency band in the vicinity of double the main-mode frequency and of a higher-order mode in the middle band with varying materials for and varying thickness of the second high acoustic velocity film 6. The structure of the acoustic wave devices whose phase characteristics are described below is the same or substantially the same as in Preferred Embodiment 1, except for the material for the second high acoustic velocity film 6. In FIGS. 5 to 10, the thickness of the second high acoustic velocity film 6 (unit: μm) can be referred to in wavelength units of λ. For example, when the $Al_2O_3$ film, in FIG. 5, has a thickness of about 0.2 μm, the thickness in wavelength units is about 0.1λ.

Figure 5:
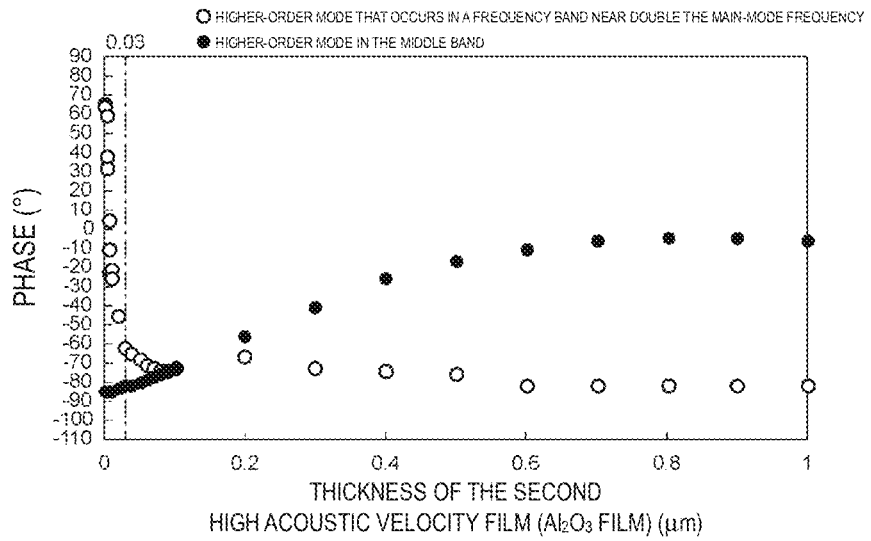
FIG. 5 is a diagram illustrating the phase characteristics of a higher-order mode that occurs in a frequency band in a vicinity of double the main-mode frequency and of a higher-order mode in the middle band from an acoustic wave device including an aluminum oxide film as its second high acoustic velocity film.

FIG. 5 is a diagram illustrating the phase characteristics of a higher-order mode that occurs in a frequency band in the vicinity of double the main-mode frequency and of a higher-order mode in the middle band from an acoustic wave device including an aluminum oxide film as its second high acoustic velocity film. FIG. 5 presents the phase of each of the modes versus the thickness of the second high acoustic velocity film. In FIG. 5, the white data points represent the phase of a higher-order mode that occurs in a frequency band in the vicinity of double the main-mode frequency, and those in black represent the phase of a higher-order mode in the middle band. The same also applies to FIGS. 6 to 10, below.

As shown in FIG. 5, the higher-order mode that occurs in a frequency range in the vicinity of double the main-mode frequency is small and becomes even smaller with increasing thickness of the second high acoustic velocity film 6. Without the second high acoustic velocity film 6, the phase of the higher-order mode is approximately 66.3°, for example. When the thickness of the second high acoustic velocity film 6 is about 0.001 μm=about 0.0005λ, the phase of this higher-order mode is approximately 65.4°, for example. As can be seen from this, even a very thin second high acoustic velocity film 6 effectively reduces a higher-order mode that occurs in a frequency range in the vicinity of double the main-mode frequency. The data also indicate that the phase angle of the higher-order mode decreases as the thickness of the second high acoustic velocity film 6 increases from about 0.001 μm=about 0.0005λ to about 0.03 μm=about 0.015λ, for example.

The phase angle of the higher-order mode in the middle band becomes greater with increasing thickness of the second high acoustic velocity film 6 when the thickness of the second high acoustic velocity film 6 is about 0.7 μm=about 0.35λ or less, for example. When the second high acoustic velocity film 6 has a thickness of about 0.7 μm=about 0.35λ or more, the phase angle of this higher-order mode is almost constant. As shown, the phase angle of the middle-band higher-order mode is as small as less than about 0°.

If the second high acoustic velocity film 6 is made of aluminum oxide, it is preferred that the thickness of the second high acoustic velocity film 6 is about 0.001 μm=about 0.0005λ or more, for example. This makes it more certain that the higher-order mode that occurs in a frequency range in the vicinity of double the main-mode frequency is reduced without increasing the response of that in the middle band. More preferably, the thickness of the second high acoustic velocity film 6 is about 0.03 μm=about 0.015λ or more, for example. This further reduces the higher-order mode that occurs in a frequency range in the vicinity of double the main-mode frequency, although the response of the middle-band higher-order mode remains small. Preferably, the thickness of the second high acoustic velocity film 6 is about 1 μm=about 0.5λ or less, for example. A second high acoustic velocity film 6 having an excessively large thickness can adversely affect productivity.

Figure 6:
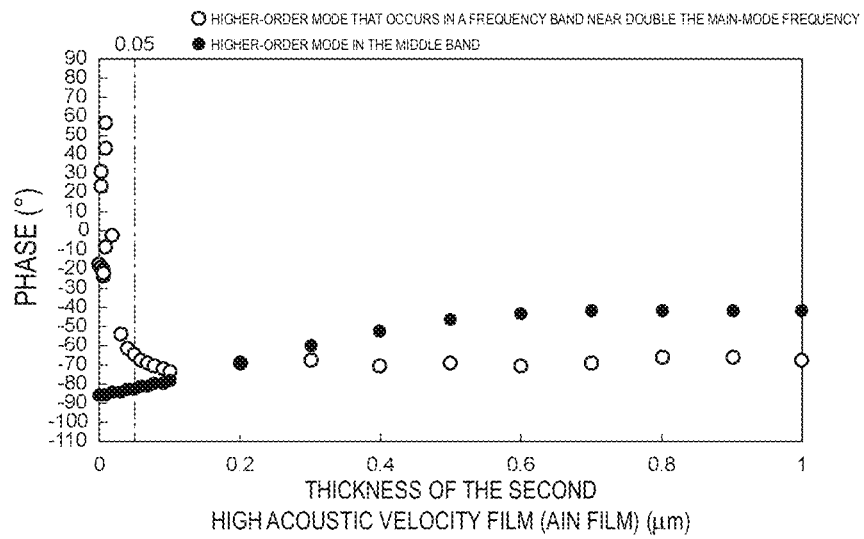
FIG. 6 is a diagram illustrating the phase characteristics of a higher-order mode that occurs in a frequency band in a vicinity of double the main-mode frequency and of a higher-order mode in the middle band from an acoustic wave device including an aluminum nitride film as its second high acoustic velocity film.

FIG. 6 is a diagram illustrating the phase characteristics of a higher-order mode that occurs in a frequency band in the vicinity of double the main-mode frequency and of a higher-order mode in the middle band from an acoustic wave device including an aluminum nitride film as its second high acoustic velocity film.

As shown in FIG. 6, with a second high acoustic velocity film 6 made of aluminum nitride, the phase angle of a higher-order mode that occurs in a frequency range in the vicinity of double the main-mode frequency is less than about 60°, which is smaller than without the second high acoustic velocity film 6, when the thickness of the second high acoustic velocity film 6 is about 0.001 μm=about 0.0005λ, for example. As can be seen from this, even a very thin second high acoustic velocity film 6 effectively reduces a higher-order mode that occurs in a frequency range in the vicinity of double the main-mode frequency. The data also indicate that the phase angle of this higher-order mode decreases as the thickness of the second high acoustic velocity film 6 increases from about 0.001 μm=about 0.0005λ to about 0.05 μm=about 0.025λ, for example.

The phase angle of the higher-order mode in the middle band becomes greater with increasing thickness of the second high acoustic velocity film 6 when the thickness of the second high acoustic velocity film 6 is about 0.6 μm=about 0.3λ or less, for example. When the second high acoustic velocity film 6 has a thickness of about 0.6 μm=about 0.3λ or more, the phase angle of this higher-order mode is almost constant. As shown, the phase angle of the middle-band higher-order mode is as small as less than about −40°, for example.

If the second high acoustic velocity film 6 is made of aluminum nitride, it is preferred that the thickness of the second high acoustic velocity film 6 is about 0.001 μm=about 0.0005λ or more, for example. This makes it more certain that the higher-order mode that occurs in a frequency range in the vicinity of double the main-mode frequency is reduced without increasing the response of that in the middle band. More preferably, the thickness of the second high acoustic velocity film 6 is about 0.05 μm=about 0.025λ or more, for example. This further reduces the higher-order mode that occurs in a frequency range in the vicinity of double the main-mode frequency, although the response of the middle-band higher-order mode remains small. Preferably, the thickness of the second high acoustic velocity film 6 is about 1 μm=about 0.5λ or less, for example. A second high acoustic velocity film 6 with an excessively large thickness can adversely affect productivity.

Figure 7:
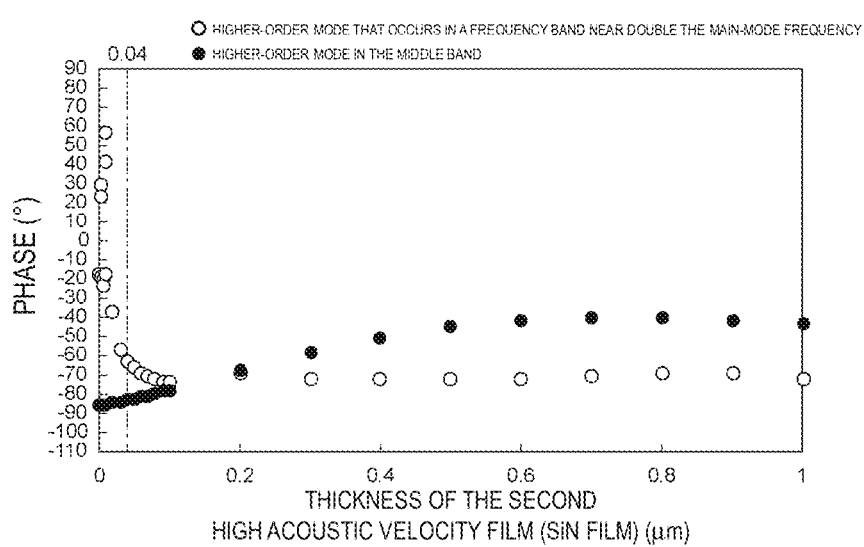
FIG. 7 is a diagram illustrating the phase characteristics of a higher-order mode that occurs in a frequency band in a vicinity of double the main-mode frequency and of a higher-order mode in the middle band from an acoustic wave device having a silicon nitride film as its second high acoustic velocity film.

FIG. 7 is a diagram illustrating the phase characteristics of a higher-order mode that occurs in a frequency band in the vicinity of double the main-mode frequency and of a higher-order mode in the middle band from an acoustic wave device including a silicon nitride film as its second high acoustic velocity film.

As shown in FIG. 7, with a second high acoustic velocity film 6 made of silicon nitride, the phase angle of a higher-order mode that occurs in a frequency range in the vicinity of double the main-mode frequency is less than about 60°, which is smaller than without the second high acoustic velocity film 6, when the thickness of the second high acoustic velocity film 6 is about 0.001 μm=about 0.0005λ, for example. As can be seen from this, even a very thin second high acoustic velocity film 6 effectively reduces a higher-order mode that occurs in a frequency range in the vicinity of double the main-mode frequency. The data also indicate that the phase angle of this higher-order mode decreases as the thickness of the second high acoustic velocity film 6 increases from about 0.001 μm=about 0.0005λ to about 0.04 μm=about 0.02λ, for example.

The phase angle of the higher-order mode in the middle band becomes greater with increasing thickness of the second high acoustic velocity film 6 when the thickness of the second high acoustic velocity film 6 is about 0.7 μm=about 0.35λ or less, for example. When the second high acoustic velocity film 6 has a thickness of about 0.7 μm=about 0.35λ or more, for example, the phase angle of this higher-order mode is almost constant. As shown, the phase angle of the middle-band higher-order mode is as small as less than about −39°.

If the second high acoustic velocity film 6 is made of silicon nitride, it is preferred that the thickness of the second high acoustic velocity film 6 is about 0.001 μm=about 0.0005λ or more, for example. This makes it more certain that the higher-order mode that occurs in a frequency range in the vicinity of double the main-mode frequency is reduced without increasing the response of that in the middle band. More preferably, the thickness of the second high acoustic velocity film 6 is about 0.04 μm=about 0.02λ or more, for example. This further reduces the higher-order mode that occurs in a frequency range in the vicinity of double the main-mode frequency, although the response of the middle-band higher-order mode remains small. Preferably, the thickness of the second high acoustic velocity film 6 is about 1 μm=about 0.5λ or less, for example. A second high acoustic velocity film 6 having an excessively large thickness can adversely affect productivity.

Figure 8:
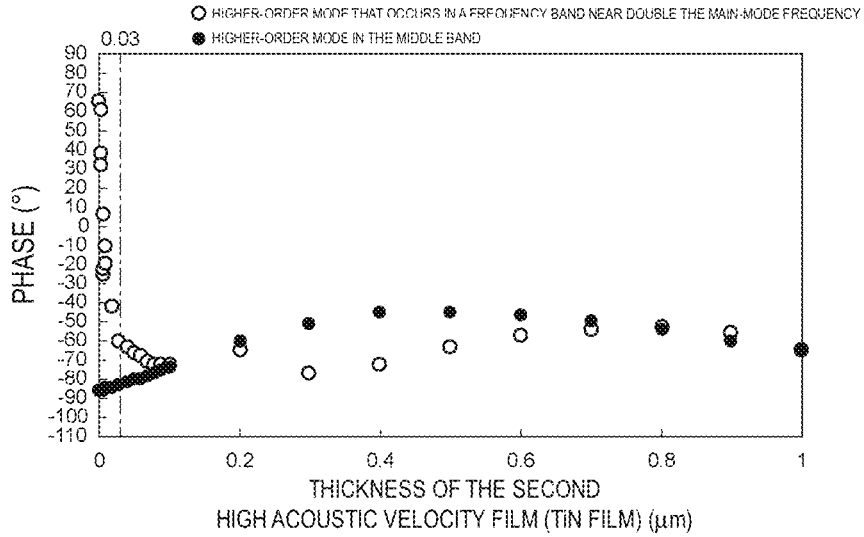
FIG. 8 is a diagram illustrating the phase characteristics of a higher-order mode that occurs in a frequency band in a vicinity of double the main-mode frequency and of a higher-order mode in the middle band from an acoustic wave device including a titanium nitride film as its second high acoustic velocity film.

FIG. 8 is a diagram illustrating the phase characteristics of a higher-order mode that occurs in a frequency band in the vicinity of double the main-mode frequency and of a higher-order mode in the middle band from an acoustic wave device including a titanium nitride film as its second high acoustic velocity film.

As shown in FIG. 8, with a second high acoustic velocity film 6 made of titanium nitride, the phase angle of a higher-order mode that occurs in a frequency range in the vicinity of double the main-mode frequency is approximately 65.4°, which is smaller than without the second high acoustic velocity film 6, when the thickness of the second high acoustic velocity film 6 is about 0.001 μm=about 0.0005λ, for example. As can be seen from this, even a very thin second high acoustic velocity film 6 effectively reduces a higher-order mode that occurs in a frequency range in the vicinity of double the main-mode frequency. The data also indicate that the phase angle of this higher-order mode decreases as the thickness of the second high acoustic velocity film 6 increases from about 0.001 μm=0.0005λ to about 0.03 μm=about 0.015λ, for example.

The phase angle of the higher-order mode in the middle band becomes greater with increasing thickness of the second high acoustic velocity film 6 when the thickness of the second high acoustic velocity film 6 is about 0.4 μm=about 0.2λ or less, for example. When the second high acoustic velocity film 6 has a thickness of about 0.4 μm=about 0.2λ or more, for example, the phase angle of this higher-order mode becomes smaller with increasing thickness of the second high acoustic velocity film 6. As shown, the phase angle of the middle-band higher-order mode is as small as less than about −40°, for example.

If the second high acoustic velocity film 6 is made of titanium nitride, it is preferred that the thickness of the second high acoustic velocity film 6 is about 0.001 μm=about 0.0005λ or more, for example. This makes it more certain that the higher-order mode that occurs in a frequency range in the vicinity of double the main-mode frequency is reduced without increasing the response of that in the middle band. More preferably, the thickness of the second high acoustic velocity film 6 is about 0.03 μm=about 0.015λ or more, for example. This further reduces the higher-order mode that occurs in a frequency range in the vicinity of double the main-mode frequency, although the response of the middle-band higher-order mode remains small. Preferably, the thickness of the second high acoustic velocity film 6 is about 1 μm=about 0.5λ or less, for example. A second high acoustic velocity film 6 having an excessively large thickness can adversely affect productivity.

Figure 9:
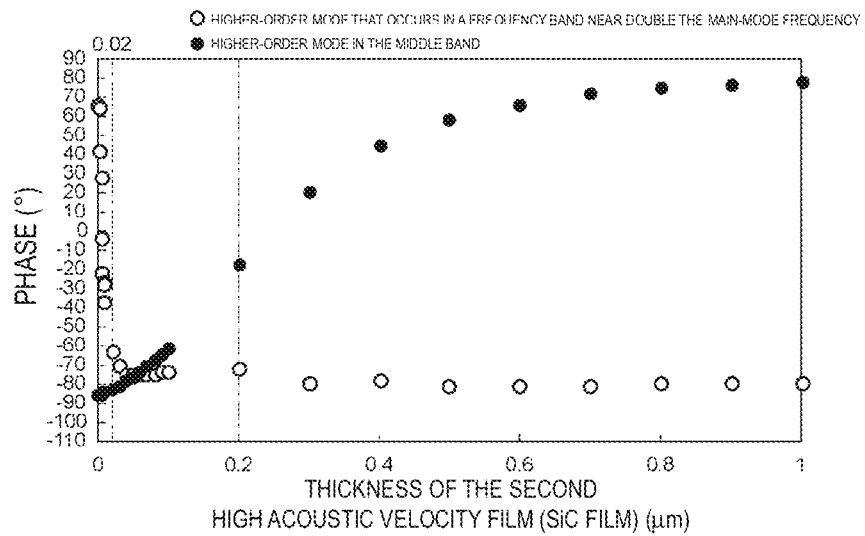
FIG. 9 is a diagram illustrating the phase characteristics of a higher-order mode that occurs in a frequency band in a vicinity of double the main-mode frequency and of a higher-order mode in the middle band from an acoustic wave device including a silicon carbide film as its second high acoustic velocity film.

FIG. 9 is a diagram illustrating the phase characteristics of a higher-order mode that occurs in a frequency band in the vicinity of double the main-mode frequency and of a higher-order mode in the middle band from an acoustic wave device including a silicon carbide film as its second high acoustic velocity film.

As shown in FIG. 9, with a second high acoustic velocity film 6 made of silicon carbide, the phase angle of a higher-order mode that occurs in a frequency range in the vicinity of double the main-mode frequency is approximately 65.6°, which is smaller than without the second high acoustic velocity film 6, when the thickness of the second high acoustic velocity film 6 is about 0.001 μm=about 0.0005λ, for example. As can be seen from this, even a very thin second high acoustic velocity film 6 effectively reduces a higher-order mode that occurs in a frequency range in the vicinity of double the main-mode frequency. The data also indicate that the phase angle of this higher-order mode decreases as the thickness of the second high acoustic velocity film 6 increases from about 0.001 μm=about 0.0005λ to about 0.02 μm=about 0.01λ, for example.

As for the higher-order mode in the middle band, its phase angle becomes greater with increasing thickness of the second high acoustic velocity film 6. When the second high acoustic velocity film 6 has a thickness of about 0.2 μm=about 0.1λ or less, for example, the phase angle is as small as less than about −18°, for example.

If the second high acoustic velocity film 6 is made of silicon carbide, it is preferred that the thickness of the second high acoustic velocity film 6 is about 0.001 μm=about 0.0005λ or more, for example. This makes it more certain that the higher-order mode that occurs in a frequency range in the vicinity of double the main-mode frequency is reduced. More preferably, the thickness of the second high acoustic velocity film 6 is about 0.02 μm=about 0.01λ or more, for example. This further reduces the higher-order mode that occurs in a frequency range in the vicinity of double the main-mode frequency. Preferably, the thickness of the second high acoustic velocity film 6 is about 1 μm=about 0.5λ or less, for example. A second high acoustic velocity film 6 having an excessively large thickness can adversely affect productivity. More preferably, the second high acoustic velocity film 6 is about 0.2 μm=about 0.1λ or less, for example. This ensures the higher-order mode that occurs in a frequency range in the vicinity of double the main-mode frequency is reduced without increasing the response of that in the middle band.

Figure 10:
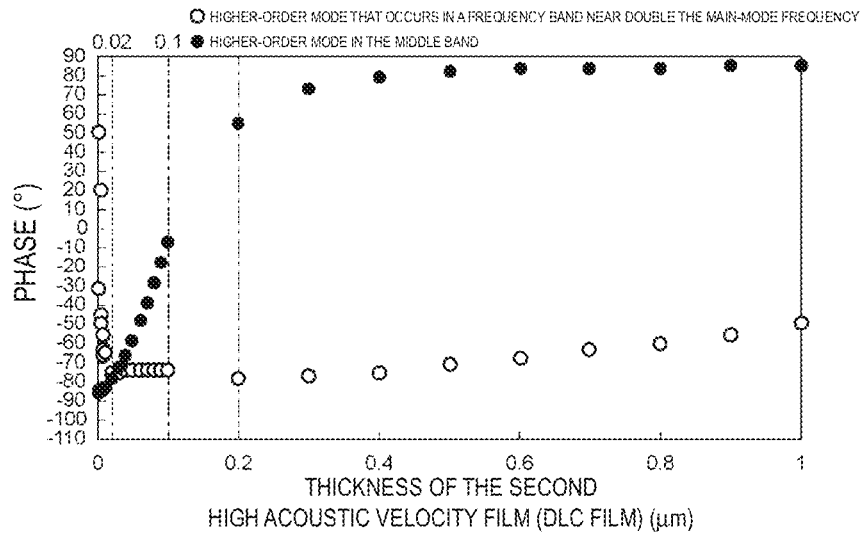
FIG. 10 is a diagram illustrating the phase characteristics of a higher-order mode that occurs in a frequency band in a vicinity of double the main-mode frequency and of a higher-order mode in the middle band from an acoustic wave device including a DLC film as its second high acoustic velocity film.

FIG. 10 is a diagram illustrating the phase characteristics of a higher-order mode that occurs in a frequency band in the vicinity of double the main-mode frequency and of a higher-order mode in the middle band from an acoustic wave device including a DLC film as its second high acoustic velocity film.

As shown in FIG. 10, with a second high acoustic velocity film 6 made of DLC (diamond-like carbon), the phase angle of a higher-order mode that occurs in a frequency range in the vicinity of double the main-mode frequency is less than about 51°, for example, which is smaller than without the second high acoustic velocity film 6, when the thickness of the second high acoustic velocity film 6 is about 0.001 μm, for example. As can be seen from this, even a very thin second high acoustic velocity film 6 effectively reduces a higher-order mode that occurs in a frequency range in the vicinity of double the main-mode frequency. The data also indicate that the phase angle of this higher-order mode decreases as the thickness of the second high acoustic velocity film 6 increases from about 0.001 μm to about 0.02 μm, for example.

As for the higher-order mode in the middle band, its phase angle becomes greater with increasing thickness of the second high acoustic velocity film 6. When the second high acoustic velocity film 6 has a thickness of about 0.2 μm or less, as shown, it is as small as less than about 56°, for example.

If the second high acoustic velocity film 6 is made of DLC, it is preferred that the thickness of the second high acoustic velocity film 6 is about 0.001 μm=about 0.0005λ or more, for example. This makes it more certain that the higher-order mode that occurs in a frequency range in the vicinity of double the main-mode frequency is reduced. More preferably, the thickness of the second high acoustic velocity film 6 is about 0.02 μm=about 0.01λ or more. This further reduces the higher-order mode that occurs in a frequency range in the vicinity of double the main-mode frequency. Preferably, the thickness of the second high acoustic velocity film 6 is about 0.2 μm=about 0.1λ or less, for example. This ensures the higher-order mode that occurs in a frequency range in the vicinity of double the main-mode frequency is reduced without increasing the response of that in the middle band. More preferably, the second high acoustic velocity film 6 is about 0.1 μm=about 0.05λ or less, for example. This ensures the higher-order mode that occurs in a frequency range in the vicinity of double the main-mode frequency is reduced without further increasing the response of that in the middle band.

The acoustic wave device, can produce unnecessary Rayleigh waves. Preferably, the phase of the Rayleigh waves, which is derived from the second Euler angle θ of the piezoelectric layer 7, the thickness of the piezoelectric layer 7, and the thickness of the second high acoustic velocity film 6, is about −70 [deg] or less, for example. The second Euler angle is θ in the Euler angles (ϕ, θ, ψ). The inventor of preferred embodiments of the present invention has derived mathematical relationships between the phase of the Rayleigh waves and the second Euler angle θ of the piezoelectric layer 7, the thickness of the piezoelectric layer 7, and the thickness of the second high acoustic velocity film 6. The relationships derived for second high acoustic velocity films made of aluminum oxide, aluminum nitride, silicon nitride, titanium nitride, silicon carbide, and DLC are as follows. In Equations 1 to 6, below, the thickness of the piezoelectric layer 7 is referred to as LT thickness.

If the second high acoustic velocity film 6 is made of aluminum oxide (alumina), Equation 1, below, is satisfied. In this case, it is preferred that the phase of Rayleigh waves derived from Equation 1 is about −70 [deg] or less, for example.

Rayleigh phase [deg]=(−16.8545143571569)+
97.769056003768×(("alumina film thickness
[λ]")−0.299689440993788)+(−
2.6222607088467)×(θ−119.937888198758)+(−
282.154623221267)×(("LT thickness [λ]")−
0.2)+4.93969565597642×((("alumina film
thickness [λ]")−0.299689440993788)×(θ−
119.937888198758))+(−0.0295924224754759×
((θ−119.937888198758)×(θ−
119.937888198758)−167.076887465761)+(−
1314.85396825397)×((("alumina film thickness
[λ]")−0.299689440993788)×(("LT thickness
[λ]")−0.2))+−3384.6493197249×((("LT thick-
ness [λ]")−0.2)×(("LT thickness [λ]")−0.2)−
0.00167701863354037)     Equation 1

If the second high acoustic velocity film 6 is made of aluminum nitride (AlN), Equation 2, below, is satisfied. In this case, it is preferred that the phase of Rayleigh waves derived from Equation 2 is about −70 [deg] or less, for example.

Rayleigh phase [deg]=(−37.5643957933033)+(−
29.6758932805944×(("AlN film thickness
[λ]")−0.251030927835052)+(−
1.93437980402609)λ(θ−120.154639175258)+(−
88.0436542426653)λ(("LT thickness [λ]")−
0.2)+(−180.542638760286)×(("AlN film
thickness [λ]")−0.251030927835052)×(("AlN
film thickness [λ]")−0.251030927835052)−
0.0198958444042938)+2.1537674557557×
((("AlN film thickness [λ]")−
0.251030927835052)×(θ−120.154639175258))+
0.0188234673540556×((θ−120.154639175258)×
(θ−120.154639175258)−347.141035179084)+(−
810.883076923076)×((("AlN film thickness
[λ]")−0.251030927835052)×(("LT thickness
[λ]")−0.2))     Equation 2

If the second high acoustic velocity film 6 is made of silicon nitride (SiN), Equation 3, below, is satisfied. In this case, it is preferred that the phase of Rayleigh waves derived from Equation 3 is about −70 [deg] or less, for example.

Rayleigh phase [deg]=(−29.5598032009782)+(−
17.4169410027003×(("SiN film thickness [λ]")−
0.2078125)+(−2.17770205570849×(θ−
116.8359375)+(−108.791468323085)×(("LT
thickness [λ]")−0.218359375)+(−
258.102094467389)×((("SiN film thickness
[λ]")−0.2078125)×(("SiN film thickness [λ]")−
0.2078125)−0.01993896484375)+
1.65613360444838×((("SiN film thickness
[λ]")−0.2078125)×(θ−116.8359375))+
0.0423927399677696×((θ−116.8359375)×(θ−
116.8359375)−345.262145996094)+(−
1190.85587409073×((("SiN film thickness
[λ]")−0.2078125)×(("LT thickness [λ]")−
0.218359375))     Equation 3

If the second high acoustic velocity film 6 is made of titanium nitride (TiN), Equation 4, below, is satisfied. In this case, it is preferred that the phase of Rayleigh waves derived from Equation 4 is about −70 [deg] or less, for example.

Rayleigh phase [deg]=(−16.2142363636363)+
1.42790909090932×(("TiN film thickness [λ]")−
0.250000000000001)+(−2.60326848484848)×
(θ−115)+(−59.2025454545439×(("LT thickness
[λ]")−0.2)+(−255.862987012988)×((("TiN film
thickness [λ]")−0.250000000000001)×(("TiN
film thickness [λ]")−0.250000000000001)−
0.0199999999999999)+5.77687212121213×
((("TiN film thickness [λ]")−
0.250000000000001)×(θ−115))+(−
0.0304083512043512)×((θ−115)×(θ−115)−250)+
(−707.443636363637)×((("TiN film thickness
[λ]")−0.250000000000001)×(("LT thickness
[λ]")−0.2))+(−2796.13090909091)×((("LT thick-
ness [λ]")−0.2)×(("LT thickness [λ]")−0.2)−
0.00166666666666667)     Equation 4

If the second high acoustic velocity film 6 is made of silicon carbide (SiC), Equation 5, below, is satisfied. In this case, it is preferred that the phase of Rayleigh waves derived from Equation 5 about −70 [deg] or less, for example.

Rayleigh phase [deg]=(−21.4839730255735)+
39.6748568482748λ(("SiC film thickness [λ]")−
0.249484536082475)+(−2.53125771138018)×
(θ−120.103092783505)+(−77.472140368071)×
(("LT thickness [λ]")−0.200257731958763)+(−
130.531085369884)×((("SiC film thickness
[h/λ]")−0.249484536082475)×(("SiC film thick-
ness [λ]")−0.249484536082475)−
0.0200512806887023)+(−1.88180619211659)×
((("SiC film thickness [λ]")−
0.249484536082475)×(θ−120.103092783505))+
0.0253932500196326×((θ−120.103092783505)×
(θ−120.103092783505)−349.731639919226)+(−

670.587481630436)×((("SiC film thickness [λ]")−0.249484536082475)×(("*LT* thickness [λ]")−0.200257731958763))  Equation 5

If the second high acoustic velocity film 6 is made of DLC, Equation 6, below, is satisfied. In this case, it is preferred that the phase of Rayleigh waves derived from Equation 6 is about −70 [deg] or less, for example.

Rayleigh phase [deg]=17.7229365079365+ 439.567103174603×(("DLC film thickness [λ]")−0.135714285714286)+(− 2.95504619047619)×(θ−120)+ 1656.0712962963×((("DLC film thickness [λ]")−0.135714285714286)×(("DLC film thickness [λ]")−0.135714285714286)− 0.00693877551020408)+19.9962901960784× ((("DLC film thickness [λ]")− 0.135714285714286)×(θ−120))  Equation 6

Figure 11:
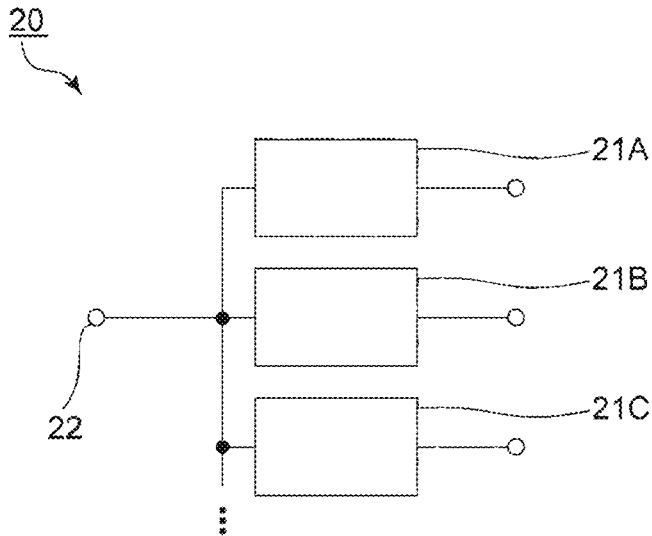
FIG. 11 is a schematic view of an acoustic wave device according to Preferred Embodiment 2 of the present invention.

FIG. 11 is a schematic view of an acoustic wave device according to Preferred Embodiment 2 of the present invention.

The acoustic wave device 20 is a multiplexer including a first filter device 21A, a second filter device 21B, and a third filter device 21C. The first filter device 21A is a filter device that includes an acoustic wave resonator structured in the same way as the acoustic wave device 1 according to Preferred Embodiment 1. The second filter device 21B has its pass band in the 5-GHz band. The third filter device 21C has its pass band in the middle band.

The acoustic wave device 20 includes a common connection terminal 22. To the common connection terminal 22, the first, second, and third filter devices 21A, 21B, and 21C are connected. The common connection terminal 22 may be, for example, an antenna terminal to connect to an antenna. The number of filter devices in the acoustic wave device 20 is not critical. The acoustic wave device 20 also includes filter devices other than the first, second, and third filter devices 21A, 21B, and 21C, which are also connected to the common connection terminal 22.

By including an acoustic wave resonator structured in the same way as in Preferred Embodiment 1, the first filter device 21A operates with only a minor higher-order mode in a frequency range in the vicinity of double the main-mode frequency and suffers only a weak response of a higher-order mode in the middle band. This helps limit the degradation of the filter characteristics of the second and third filter devices 21B and 21C in the acoustic wave device 20.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support substrate;
a first high acoustic velocity film directly on the support substrate;
a low acoustic velocity film on the first high acoustic velocity film;
a second high acoustic velocity film on the low acoustic velocity film;
a piezoelectric layer on the second high acoustic velocity film; and
an IDT on the piezoelectric layer; wherein
an acoustic velocity of bulk waves that propagate through the low acoustic velocity film is lower than an acoustic velocity of bulk waves that propagate through the piezoelectric layer;
an acoustic velocity of bulk waves that propagate through the first high acoustic velocity film is higher than an acoustic velocity of acoustic waves that propagate through the piezoelectric layer;
an acoustic velocity of bulk waves that propagate through the second high acoustic velocity film is equal to or higher than an acoustic velocity of bulk waves that propagate through the first high acoustic velocity film; and
a thickness of the second high acoustic velocity film is different than a thickness of the first high acoustic velocity film.

2. The acoustic wave device according to claim 1, wherein a material of the second high acoustic velocity film is aluminum oxide, aluminum nitride, silicon nitride, titanium nitride, silicon carbide, or diamond-like carbon.

3. The acoustic wave device according to claim 2, wherein the material and the thickness of the second high acoustic velocity film are any of combinations listed in Table 1:

TABLE 1

| Material of the second high acoustic velocity film | Thickness T of the second high acoustic velocity film (μm) | Thickness T of the second high acoustic velocity film (λ) |
| --- | --- | --- |
| Aluminum oxide ($Al_2O_3$) | $0.001 \le T \le 1$ | $0.0005 \le T \le 0.5$ |
| Aluminum nitride (AlN) | $0.001 \le T \le 1$ | $0.0005 \le T \le 0.5$ |
| Silicon nitride (SiN) | $0.001 \le T \le 1$ | $0.0005 \le T \le 0.5$ |
| Titanium nitride (TiN) | $0.001 \le T \le 1$ | $0.0005 \le T \le 0.5$ |
| Silicon carbide (SiC) | $0.001 \le T \le 1$ | $0.0005 \le T \le 0.5$ |
| Diamond-like carbon (DLC) | $0.001 \le T \le 0.2$ | $0.0005 \le T \le 0.1$ |

4. The acoustic wave device according to claim 1, wherein the support substrate is a silicon substrate.

5. The acoustic wave device according to claim 4, wherein a surface of the support substrate closest to the first high acoustic velocity film is (111)-oriented.

6. The acoustic wave device according to claim 1, wherein a phase of a Rayleigh wave, which is defined by a second Euler angle θ of the piezoelectric layer, a thickness of the piezoelectric layer, and the thickness of the second high acoustic velocity film, is about −70 [deg] or less.

7. The acoustic wave device according to claim 2, wherein the support substrate is a silicon substrate.

8. The acoustic wave device according to claim 7, wherein a surface of the support substrate closest to the first high acoustic velocity film is (111)-oriented.

9. The acoustic wave device according to claim 3, wherein the support substrate is a silicon substrate.

10. The acoustic wave device according to claim 9, wherein a surface of the support substrate closest to the first high acoustic velocity film is (111)-oriented.

11. The acoustic wave device according to claim 2, wherein a phase of a Rayleigh wave, which is defined by a second Euler angle θ of the piezoelectric layer, a thickness of the piezoelectric layer, and the thickness of the second high acoustic velocity film, is about −70 [deg] or less.

12. The acoustic wave device according to claim 3, wherein a phase of a Rayleigh wave, which is defined by a second Euler angle θ of the piezoelectric layer, a thickness of the piezoelectric layer, and the thickness of the second high acoustic velocity film, is about −70 [deg] or less.

13. The acoustic wave device according to claim 4, wherein a phase of a Rayleigh wave, which is defined by a second Euler angle θ of the piezoelectric layer, a thickness of the piezoelectric layer, and the thickness of the second high acoustic velocity film, is about −70 [deg] or less.

14. The acoustic wave device according to claim 5, wherein a phase of a Rayleigh wave, which is defined by a second Euler angle θ of the piezoelectric layer, a thickness of the piezoelectric layer, and the thickness of the second high acoustic velocity film, is about −70 [deg] or less.

* * * * *